United States Patent
Chen et al.

(10) Patent No.: US 7,321,157 B2
(45) Date of Patent: Jan. 22, 2008

(54) COSB$_3$-BASED THERMOELECTRIC DEVICE FABRICATION METHOD

(75) Inventors: Lidong Chen, Shanghai (CN); Junfeng Fan, Shanghai (CN); Shengqiang Bai, Shanghai (CN); Jihui Yang, Lakeshore (CA)

(73) Assignees: GM Global Technology Operations, Inc., Detroit, MI (US); Dalian Institute of Chemical Physics, Chinese Academy of Sciences, Dalian (CN)

( * ) Notice: Subject to any disclaimer, the term of this patent is extended or adjusted under 35 U.S.C. 154(b) by 140 days.

(21) Appl. No.: 11/096,870

(22) Filed: Apr. 1, 2005

(65) Prior Publication Data

US 2006/0017170 A1 Jan. 26, 2006

Related U.S. Application Data

(60) Provisional application No. 60/590,632, filed on Jul. 23, 2004.

(51) Int. Cl.
*H01L 31/058* (2006.01)

(52) U.S. Cl. ............... 257/467; 257/930; 257/763; 257/44; 257/45; 257/E31.005; 136/237; 136/240

(58) Field of Classification Search ............ 257/467
See application file for complete search history.

(56) References Cited

U.S. PATENT DOCUMENTS

| | | | |
|---|---|---|---|
| 3,880,674 A * | 4/1975 | Saunders | 136/237 |
| 6,288,322 B1 * | 9/2001 | Kawasaki et al. | 136/205 |
| 6,410,840 B1 * | 6/2002 | Sudo et al. | 136/201 |
| 6,759,586 B2 * | 7/2004 | Shutoh et al. | 136/205 |
| 2003/0041892 A1 * | 3/2003 | Fleurial et al. | 136/227 |
| 2004/0031515 A1 * | 2/2004 | Sadatomi et al. | 136/239 |
| 2004/0195934 A1 * | 10/2004 | Tanielian | 310/306 |

* cited by examiner

*Primary Examiner*—Tu-Tu V. Ho

(57) ABSTRACT

A method of fabricating a CoSb$_3$-based thermoelectric device is disclosed. The method includes providing a high-temperature electrode, providing a buffer layer on the high-temperature electrode, forming composite n-type and p-type layers, attaching the buffer layer to the composite n-type and p-type layers, providing a low-temperature electrode on the composite n-type and p-type layers and separating the composite n-type and p-type layers from each other to define n-type and p-type legs between the high-temperature electrode and the low-temperature electrode.

20 Claims, 3 Drawing Sheets

COSB₃-BASED THERMOELECTRIC DEVICE FABRICATION METHOD

CROSS REFERENCE TO RELATED APPLICATION

This application claims the benefit of a U.S. Provisional Application Ser. No. 60/590,632 filed Jul. 23, 2004.

FIELD OF THE INVENTION

The present invention relates to thermoelectric devices which utilize a thermal gradient to generate electrical power. More particularly, the present invention relates to an expeditious method of fabricating a $CoSb_3$-based thermoelectric (TE) device by using a spark plasma sintering (SPS) process to attach a high-temperature electrode to a buffer layer and to attach the buffer layer to p-type and n-type legs of the device.

BACKGROUND OF THE INVENTION

With the recent discovery of high-efficiency thermoelectric (TE) materials, potential applications of TE technology have attracted worldwide interest. TE devices can be used for cooling and power generation purposes in a variety of applications and have the potential for high reliability, long life and environmentally safe operation. While most of the work in thermoelectric technology has focused on the development of new materials, of equal importance is investigation of the fabrication issues regarding incorporation of the newly-developed materials into TE devices.

Filled skutterudites are prospective high-efficiency materials for TE power generation by TE devices having a hot side temperature ($T_H$) of between 450 degrees C. and 600 degrees C. For simplicity and proof of concept, binary n-type and p-type $CoSb_3$ skutterudites are used to fabricate the n-type and p-type legs of thermoelectric devices. Copper is used as the electrode material at the cold side of the device.

Because of the relatively high $T_H$ at the hot side of the device, selection of the high-temperature electrode material is important. First, the high-temperature electrode material should neither react with $CoSb_3$ nor diffuse into the $CoSb_3$ at the $T_H$. Second, the high-temperature electrode material should have high electrical and thermal conductivity values. Third, the material should have a thermal expansion coefficient which is comparable to that of $CoSb_3$ to prevent breakage or cracking. Finally, the material should not be oxidized easily.

Due to its high electrical conductivity ($18.1 \times 10^6 \, \Omega^{-1} \, m^{-1}$) and thermal conductivity (138 W/mK), molybdenum (Mo) is a good candidate for the high temperature electrode material. In addition, its room temperature thermal expansion coefficient is close to that of $CoSb_3$. The room temperature thermal expansion coefficients for both n-type and p-type $CoSb_3$ are about $8.0 \times 10^{-6} \, K^{-1}$. Furthermore, Mo does not oxidize easily. However, because it has a high melting point (2623 degrees C.), Mo is difficult to be directly joined to $CoSb_3$, which has a melting point of 876 degrees C.

Therefore, utilization of a titanium buffer layer between the molybdenum high-temperature electrode and the $CoSb_3$ n-type and p-type legs is needed in the fabrication of a thermoelectric device since titanium has relatively large electrical and thermal conductivities, a thermal expansion coefficient which is comparable to that of $CoSb_3$, is oxidation-resistant and has a melting point which is much lower than that of molybdenum.

SUMMARY OF THE INVENTION

The present invention is generally directed to a novel method of fabricating a thermoelectric device having a high efficiency and durability. The method includes attaching a high-temperature electrode layer, typically molybdenum, to a buffer layer, typically titanium, using spark plasma sintering (SPS); forming adjacent composite binary skutterudite $CoSb_3$ n-type and p-type layers using SPS; attaching the buffer layer to the composite n-type and p-type layers using SPS; attaching a low-temperature electrode layer to the composite n-type and p-type layers; and cutting between the composite n-type and p-type layers to form separate n-type and p-type legs which connect the high-temperature electrode layer to the low-temperature electrode layer.

BRIEF DESCRIPTION OF THE DRAWINGS

The invention will now be described, by way of example, with reference to the accompanying drawings, in which.

DETAILED DESCRIPTION OF THE INVENTION

The present invention contemplates a novel method of fabricating a thermoelectric device having a high efficiency and durability. According to the method, spark plasma sintering (SPS) is used to attach a typically molybdenum high-temperature electrode layer to a typically titanium buffer layer to form an electrode/buffer layer. SPS is then used to form adjacent composite binary skutterudite $CoSb_3$ n-type and p-type layers and to attach the electrode/buffer layer to the n-type and p-type composite layers. A low-temperature electrode layer is attached to the composite n-type and p-type layers, typically using a conventional soldering method. Finally, the composite n-type and p-type layers are cut to form separate n-type and p-type legs which connect the high-temperature electrode layer to the low-temperature electrode layer in the finished thermoelectric device. The use of SPS as a rapid sintering technique facilitates the rapid fabrication of n-type and p-type legs in the thermoelectric device.

Figure 1:
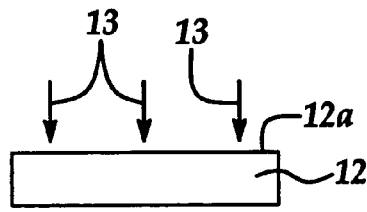
FIG. 1 is a cross-section of a high-temperature electrode subjected to an ultrasonic pretreatment process according to the method of the present invention.
Figure 5:
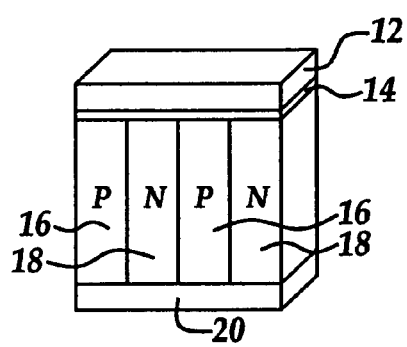
FIG. 5 is a perspective view of a thermoelectric device fabricated according to the invention, prior to cutting between the composite n-type and p-type layers.
Figure 6:
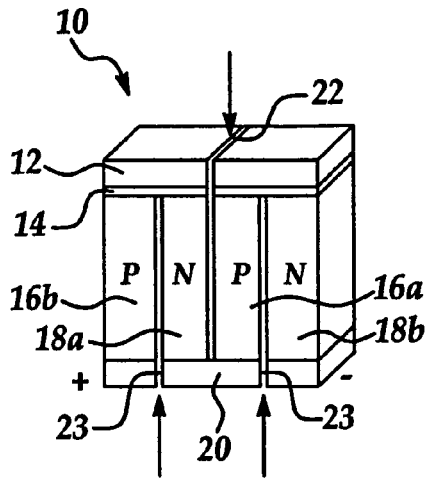
FIG. 6 is a perspective view of a thermoelectric device illustrating cutting between the composite n-type and p-type layers to form the connecting n-type and p-type legs in fabrication of the device according to the present invention.
Figure 7:
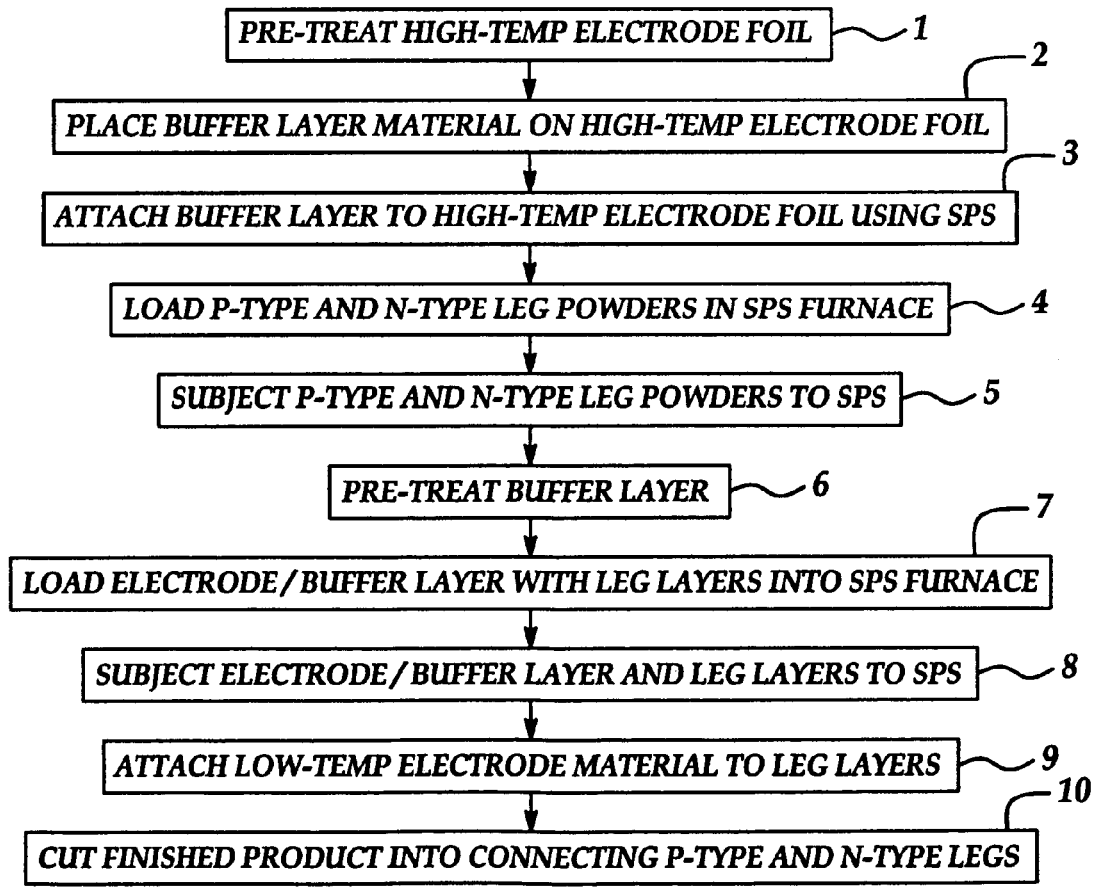
FIG. 7 is a flow diagram which illustrates sequential process steps carried out according to the method of the present invention.

Sequential process steps carried out according to the thermoelectric device fabrication method of the present invention are shown schematically in FIGS. 1-6 and as a flow diagram in FIG. 7. As a first step according to the method, as shown in FIG. 1 and indicated in step 1 of FIG. 7, a high-temperature electrode foil 12, which is preferably a molybdenum foil having a thickness of typically about 0.5~1.5 mm, is pretreated ultrasonically for typically about 5~10 minutes with SiC or diamond sand 13 having a particle size of typically about 0.5~5 μm. This pre-treatment step imparts roughness to the surface 12a of the high-temperature electrode foil 12.

As indicated in step 2 of FIG. 7, buffer layer material is then placed on the pre-treated surface 12a of the high-temperature electrode foil 12. The buffer layer material is preferably a titanium powder (99.9% pure, 200~400 mesh) or a titanium foil (99.9% pure) which is laid on the pre-treated surface 12a of the high-temperature electrode foil 12. As indicated in step 3 and shown in FIG. 2, the buffer layer 14 is attached to the pretreated surface 12a of the high-temperature electrode foil 12 to define an electrode/buffer layer 11. This step may be carried out using SPS under vacuum or an inert gas atmosphere for about 5~30 minutes, with about 20~60 MPa pressure, and at a temperature of about 950~1000 degrees C.

Figure 3:
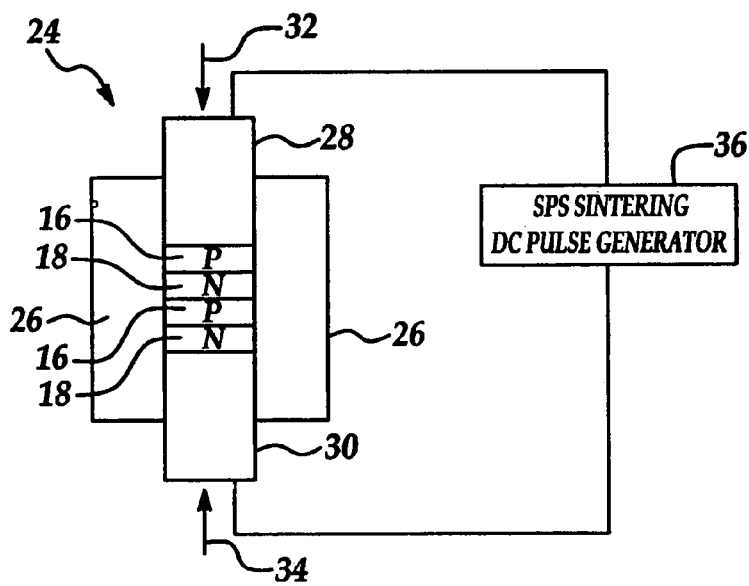
FIG. 3 is a schematic illustrating formation of composite n-type and p-type layers using a spark plasma sintering (SPS) technique according to the present invention.
Figure 4:
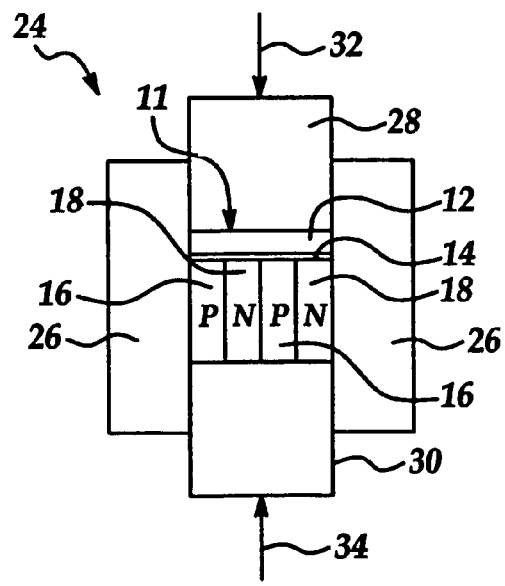
FIG. 4 is a schematic illustrating attachment of an electrode/buffer layer to composite n-type and p-type layers using SPS according to the present invention.

A SPS (spark plasma sintering) apparatus 24, which may be conventional, is shown schematically in FIG. 3. The SPS apparatus 24 includes an upper punch 28 and a lower punch 30 to which are attached thermocouples 26. A DC pulse generator 36 is electrically connected to the upper punch 28 and lower punch 30.

As shown in FIG. 3 and indicated in step 4 of FIG. 7, powders of p-type and n-type $CoSb_3$ are loaded as alternative p-type layers 16 and n-type layers 18 between the upper punch 28 and the lower punch 30 of the SPS apparatus 24. The desired cross-sectional thicknesses of the p-type and n-type legs in the fabricated thermoelectric device determine the quantity of p-type and n-type powders loaded in the SPS apparatus 24. In step 5, the p-type layers 16 and n-type layers 18 are then sintered as a composite layer at a temperature of between typically about 560 degrees C. and 590 degrees C. with a pressure 32 of typically about 20 to 80 MPa.

Figure 2:
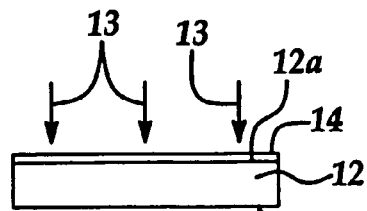
FIG. 2 is a cross-section of an electrode/buffer layer fabricated according to the method of the present invention.

In step 6, the surface of the buffer layer 14 is next pre-treated ultrasonically with 0.5~5 μm diamond sand 13, as further shown in FIG. 2, for typically about 5~10 minutes to impart surface roughness to the buffer layer 14. As indicated in step 7 and shown in FIG. 4, the electrode/buffer layer 11, which includes the high-temperature electrode foil 12 and the buffer layer 14 previously sintered together in step 3, is next loaded with the composite p-type layers 16 and n-type layers 18 in the SPS apparatus 24. The pretreated surface of the buffer layer 14 is placed into contact with the composite p-type layers 16 and n-type layers 18. As indicated in step 8, the electrode/buffer layer 11 and composite layers are then subjected to spark plasma sintering at a temperature of between typically about 560~590 degrees C. with typically about 20~80 MPa pressure for about 5~60 minutes. The relatively low melting point of the titanium buffer layer 14 facilitates attachment of the high-temperature electrode foil 12 to the composite p-type layers 16 and n-type layers 18.

As indicated in step 9 and shown in FIG. 5, a low-temperature electrode 20 is next attached to the ends of the composite p-type layers 16 and n-type layers 18 which are opposite the electrode/buffer layer 11. Preferably, the low-temperature electrode 20 is copper. The low-temperature electrode 20 may be formed using conventional soldering techniques known to those skilled in the art.

As indicated in step 10 and shown in FIG. 6, fabrication of the thermoelectric device 10 may be completed by cutting a central saw line 22 through the high-temperature electrode 12 and buffer layer 14 and to the low-temperature electrode 20 to define a central p-type leg 16a and n-type leg 18a. This may be carried out using a conventional wire saw. In similar fashion, peripheral saw lines 23 may be cut through the low-temperature electrode 20 and to the buffer layer 14 to define a peripheral p-type leg 16b and a peripheral n-type leg 18b. Accordingly, responsive to a thermal gradient established between the high-temperature electrode 12 and the low-temperature electrode 20, the central p-type leg 16a, the peripheral p-type leg 16b, the central n-type leg 18a and the peripheral n-type leg 18b conduct the flow of electrons from the high-temperature electrode 12 to the low-temperature electrode 20 in the finished thermoelectric device 10. The relatively large electrical conductivity of the titanium buffer layer 14 facilitates electrical conductance between the high-temperature electrode 12 and the low-temperature electrode 20.

Figure 8A:
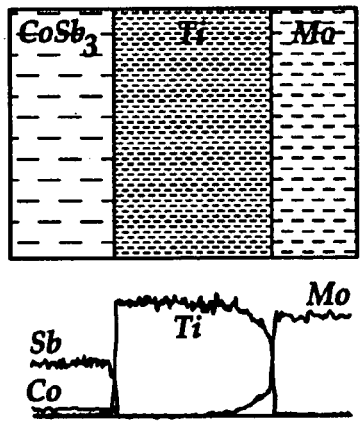
FIG. 8 shows scanning electron micrograph (SEM) images (top panels) and elemental composition intensities (bottom panels) obtained by electron probe microanalysis (EPMA) of the $CoSb_3$, Ti and Mo composite and the $CoSb_3$ and Ti interface of a thermoelectric device fabricated according to the method of the present invention.
Figure 8B:
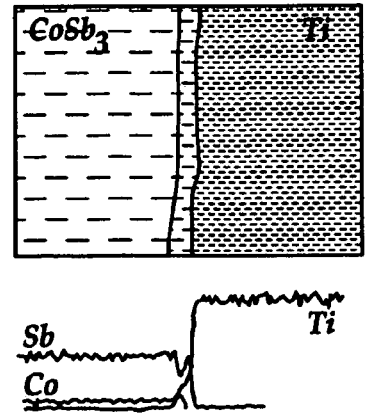
Figure 9:
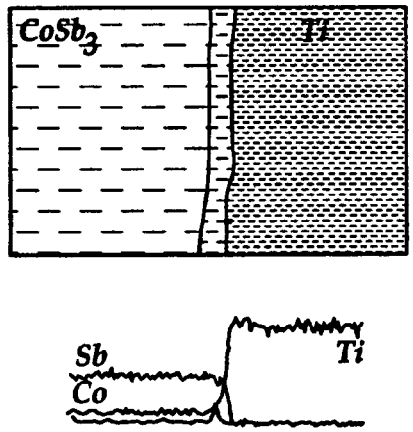
FIG. 9 shows SEM images (top panel) and elemental composition intensities obtained by EPMA (bottom panels) of the $CoSb_3$ and Ti interface after 1000 hours of thermal fatigue testing at 500 degrees C.

FIG. 8 shows scanning electron microscopy (SEM) images (top panels) and elemental composition intensities obtained by electron probe microanalysis (EPMA, bottom panels) of the $CoSb_3$, Ti and Mo composite and the $CoSb_3$ and Ti interface of a thermoelectric device fabricated according to the method of the present invention. The yield strength of the prepared sample is 65 MPa. The interfaces are crack-free and show no signs of significant inter-diffusion. As shown in FIG. 9, after a 1000-hour thermal fatigue test carried out at 500 degrees C., the interfaces remain unchanged and the yield strength drops slightly to 63 MPa.

Figure 10:
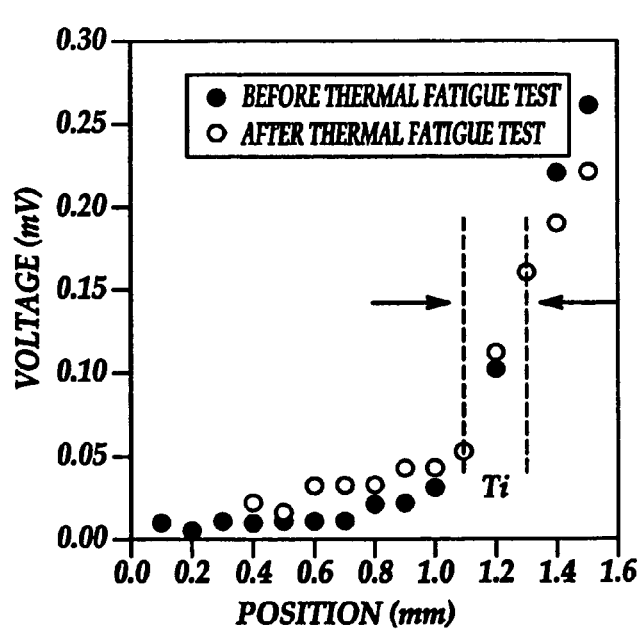
FIG. 10 is a graph which illustrates voltage drop as a function of position across the $CoSb_3$ and the electrode interface before and after thermal fatigue testing.

FIG. 10 shows the measured voltage drop as a function of position across the interfaces at room temperature using a 10 mA electrical current, before and after the thermal fatigue test. The contact resistances at the interfaces remain approximately unchanged after thermal fatigue testing.

While the preferred embodiments of the invention have been described above, it will be recognized and understood that various modifications can be made in the invention and the appended claims are intended to cover all such modifications which may fall within the spirit and scope of the invention.

What is claimed is:

1. A product comprising:
    a thermoelectric device comprising:
    a high-temperature electrode;
    a buffer layer attached directly to said high-temperature electrode the buffer layer having a roughened surface, wherein the buffer layer comprises sintered powder or foil;
    n-type and p-type legs provided in electrical contact with said buffer layer; wherein each of the n-type and p-type legs are directly attached to the roughened surface of the buffer layer and
    a low-temperature electrode provided in electrical contact with said n-type and p-type legs.

2. The product of claim 1 wherein said composite n-type and p-type layers comprises $CoSb_3$.

3. The product of claim 2 wherein said buffer layer comprises titanium.

4. The product of claim 3 wherein said high-temperature electrode comprises molybdenum.

5. A product as set forth in claim 1 wherein the high-temperature electrode includes a roughened surface and wherein the buffer layer is attached directly to the high-temperature electrode at the roughened surface.

6. A product as set forth in claim 1 wherein the high-temperature electrode includes a roughened surface and wherein the buffer layer is attached to the roughened surface of the high-temperature electrode.

7. A product comprising a thermoelectric device, comprising:
   a high-temperature electrode having a first roughened surface;
   providing a buffer layer attached directly to said high-temperature electrode wherein the buffer layer comprises sintered powder or a foil;
   the buffer layer having a second roughened surfaces n-type and p-type layers and wherein at least one of the n-type or p-type layers is directly attached to said buffer layer wherein at least one of the n-type or p-type layers comprises $CoSb_3$;
   a low-temperature electrode on at least one of the n-type or p-type layers.

8. The product of claim 7 wherein said buffer layer comprises titanium.

9. The product of claim 7 wherein said high-temperature electrode comprises molybdenum.

10. The product of claim 7 wherein each of the n-type and p-type layers comprises sintered material sintered by spark plasma sintering.

11. The product of claim 7 wherein said buffer layer comprises titanium.

12. The product of claim 11 wherein said high-temperature electrode comprises molybdenum.

13. A product comprising:
   a thermoelectric device comprising:
   a high-temperature electrode;
   a buffer layer attached directly to said high-temperature electrode;
   n-type and p-type legs provided in electrical contact with said buffer layer;
   a low-temperature electrode provided in electrical contact with said n-type and p-type legs; and
   a DC pulse generator electrically connected to the high-temperature electrode and low-temperature electrode.

14. A product as set forth in claim 1 wherein the buffer layer comprises sintered powder.

15. A product as set forth in claim 2 wherein the buffer layer comprises a foil.

16. A product as set forth in claim 2 wherein the buffer layer is substantially planar.

17. A product as set forth in claim 7 wherein the buffer layer comprises sintered powder.

18. A product a set forth in claim 7 wherein the buffer layer comprises a foil.

19. A product as set forth in claim 7 wherein the buffer layer is substantially planar.

20. A product comprising:
   a thermoelectric device comprising:
   a high-temperature electrode;
   a buffer layer attached directly to said high-temperature electrode, and wherein the buffer layer includes a roughened surface;
   n-type and p-type legs provided in electrical contact with said buffer layer; wherein each of the n-type and p-type legs are directly attached to the roughened surface of the buffer layer;
   a low-temperature electrode provided in electrical contact with said n-type and p-type legs; and
   a DC pulse generator electrically connected to the high-temperature electrode and low-temperature electrode.

* * * * *